United States Patent [19]

McDowell et al.

[11] Patent Number: 6,078,799
[45] Date of Patent: Jun. 20, 2000

[54] SYSTEM AND METHOD FOR CALIBRATING SINGLE SIDEBAND RECEIVER REJECT IMAGE PRODUCT

[75] Inventors: Richard L. McDowell, Chalfont; Dale H. Nelson, Shillington; Carl R. Stevenson, Macungie, all of Pa.

[73] Assignee: Lucent Technologies, Inc., Murray Hill, N.J.

[21] Appl. No.: 09/094,171

[22] Filed: Jun. 9, 1998

[51] Int. Cl.[7] ....................................................... H04B 1/10
[52] U.S. Cl. ............................................. 455/302; 455/63
[58] Field of Search ..................................... 455/550, 561, 455/77, 88, 203, 302, 62, 63

[56] References Cited

U.S. PATENT DOCUMENTS

| 4,864,643 | 9/1989 | French et al. | 455/302 |
| 5,239,683 | 8/1993 | Usui | 455/63 |
| 5,428,669 | 6/1995 | McCarthy | 455/464 |
| 5,678,220 | 10/1997 | Fournier | 455/302 |
| 5,867,766 | 2/1999 | Dinc et al. | 455/62 |
| 5,950,119 | 9/1999 | McGeehan et al. | 455/302 |

Primary Examiner—Dwayne D. Bost
Assistant Examiner—Erika A. Gary

[57] ABSTRACT

For use with a first transceiver, a system for, and method of, calibrating a first image reject mixer in the first transceiver and having first and second image products. In one embodiment, the system includes: (1) a second image reject mixer, associated with a second transceiver and tuned to a rejected one of the first and second image products. The system further includes a signal strength circuit, coupled to the second image reject mixer, that determines a signal strength of the rejected one. The system still further includes a trimmer, associated with the first image reject mixer, that trims the first image reject mixer to move the rejected one toward an optimal value of the signal strength.

20 Claims, 3 Drawing Sheets

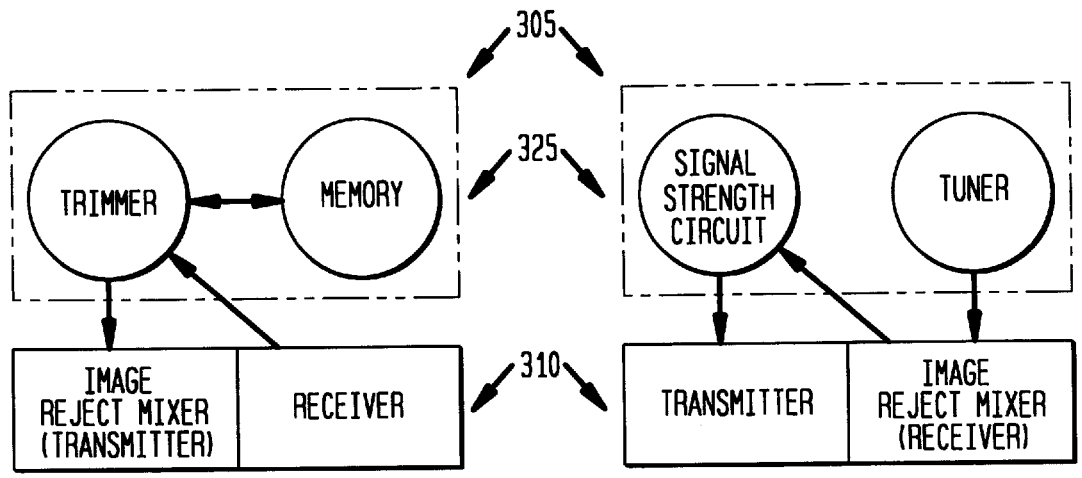
FIG. 3A  FIG. 3B
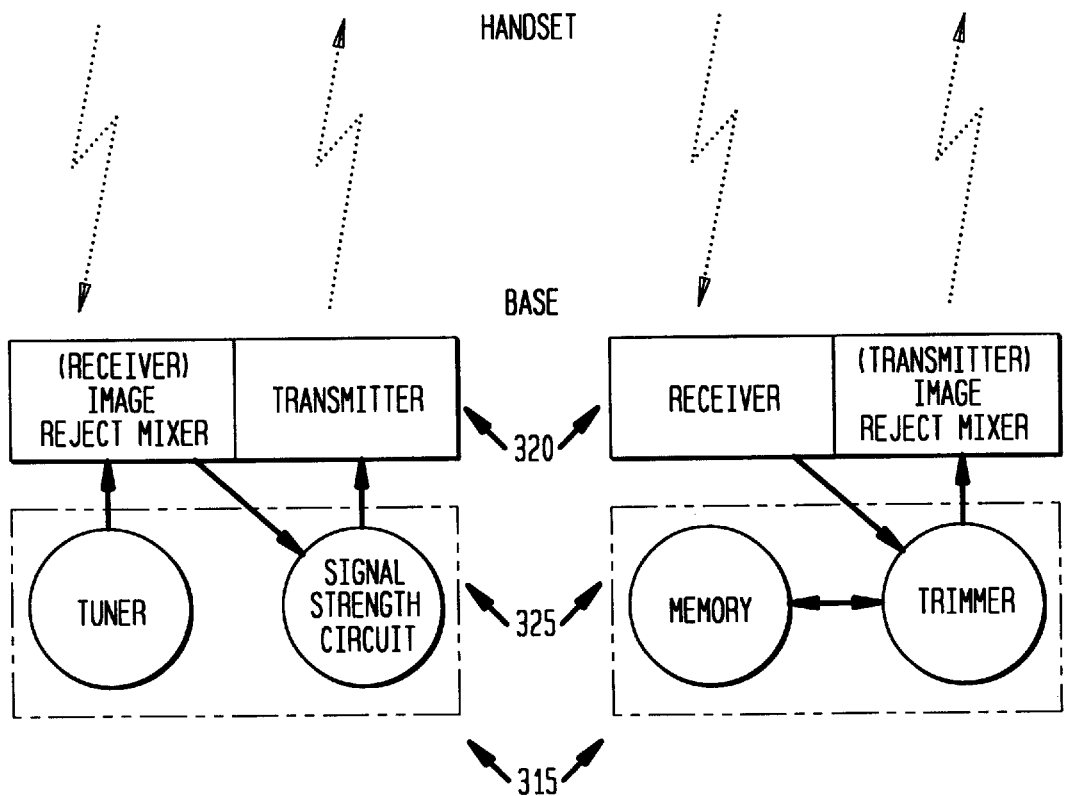

SYSTEM AND METHOD FOR CALIBRATING SINGLE SIDEBAND RECEIVER REJECT IMAGE PRODUCT

TECHNICAL FIELD OF THE INVENTION

The present invention is directed, in general, to wireless telecommunications and, more specifically, to a system and method for calibrating the rejected image product of an image product mixer and a single sideband receiver employing the same.

BACKGROUND OF THE INVENTION

Single sideband transceivers attempt to reject an undesirable sideband by cancellation techniques carried out in an image product mixer therein. When single sideband transceivers can be constructed from a collection of discrete components, the ability to select and match these components to minimize the undesirable image product allows strong image product rejection to be achieved. However, in high-volume products, where cost is usually a key factor to be minimized, the cost of labor to accomplish this is usually prohibitive. This is certainly the case with consumer cordless phones, which have both a handset and a base transceiver requiring calibration of two transmitter-receiver pairs to operate properly.

Currently, cordless phone transceivers use integrated circuit devices with minimal or no calibration adjustment capability possible. Commonly used devices, such as the AD 6190 and the MAXIM 2420, provide no means for adjustment. Mismatches in phase and amplitude from polyphase integrated circuit filters often used therein results in only approximately 35 dB of cancellation or unwanted image product rejection. The situation may be exacerbated if two cordless phones are operated close to one another. In this situation, the environment may give rise to a problem in that both cordless phones may be using a communications frequency that falls into the undesired image product. This condition generates crosstalk and interference between the two cordless phones that may degrade or disrupt communication. This degradation is usually amplified if at least one of the phones is far from its base and therefore is operating with minimal signal strength.

Accordingly, what is needed in the art is way to calibrate single sideband transceivers employed in cordless phones efficiently and effectively.

SUMMARY OF THE INVENTION

To address the above-discussed deficiencies of the prior art, the present invention provides, for use with a first transceiver, a system for, and method of, calibrating a first image reject mixer in the first transceiver and having first and second image products. In one embodiment, the system includes: (1) a second image reject mixer, associated with a second transceiver and tuned to a rejected one of the first and second image products. The system further includes a signal strength circuit, coupled to the second image reject mixer, that determines a signal strength of the rejected one. The system still further includes a trimmer, associated with the first image reject mixer, that trims the first image reject mixer to move the rejected one toward an optimal value of the signal strength.

The present invention therefore introduces a calibration procedure that employs feedback to optimize the rejected image product. The first image reject mixer is advantageously trimmed until the rejected image product is optimally diminished. "Optimally" does not necessarily mean minimally; in one embodiment to be illustrated and described, other factors may come into play in trimming the image product mixer of the first transceiver. However, the signal strength of the rejected image product can, by means of the present invention, be a component in the trimming process. For purposes of the present invention, "trimmer" is defined to include not only manually tunable devices, such as potentiometers, but also trimming circuitry or functional blocks that may be contained in integrated circuitry or embodied in digital form or as software or firmware.

In one embodiment of the present invention, the first transceiver is contained in a handset and the second transceiver is contained in a corresponding base unit of a cordless telephone, the calibrating performable while the handset is cradled in the base unit. In the embodiment to be illustrated and described, it is preferable to calibrate the first and second image reject mixers while they are in proximity to one another. Those skilled in the art will recognize, however, that the present invention is limited neither to close-range calibration or cordless telephone applications.

In one embodiment of the present invention, the second transceiver transmits a signal that depends on the signal strength to the first transceiver on a channel separate from the rejected one (perhaps the channel carrying the "accepted" or "non-rejected" image product). Thus, the non-rejected image product may be allowed to complete the feedback loop between the signal-strength-determining second transceiver and the first image reject mixer being trimmed.

In one embodiment of the present invention, the trimmer continues to trim the first transceiver after the rejected one attains the optimal signal strength at the second transceiver. This may indicate that other factors influence the final frequency at which the first image reject mixer is trimmed. Alternatively, the signal strength of the rejected image product may be the only desired factor, in which case trimming of the image reject mixer advantageously ceases upon optimization of the signal strength.

In one embodiment of the present invention, the system further includes a memory, associated with the first image reject mixer, that contains an optimal adjustment for the rejected one. Thus, the present invention contemplates an embodiment wherein calibration of the adjustment is a one-time operation, perhaps performed at the factory. Alternatively, the system can function during an idle time of the first and second image reject mixers.

This allows recalibration, wherein changing conditions may call for modifications to image reject mixer trimming.

In one embodiment of the present invention, the calibrating is performed as an iterative process. Thus, signal strength is determined, the transmitter is trimmed, signal strength is redetermined, and so on until optimization occurs. Alternatively, with an understanding of the relationship between adjustments and resulting signal strength, calibration can be performed in one step.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which:

FIGS. 3A and 3B illustrate diagrams of cordless telephones employing an embodiment of the present invention.

DETAILED DESCRIPTION

Figure 1:
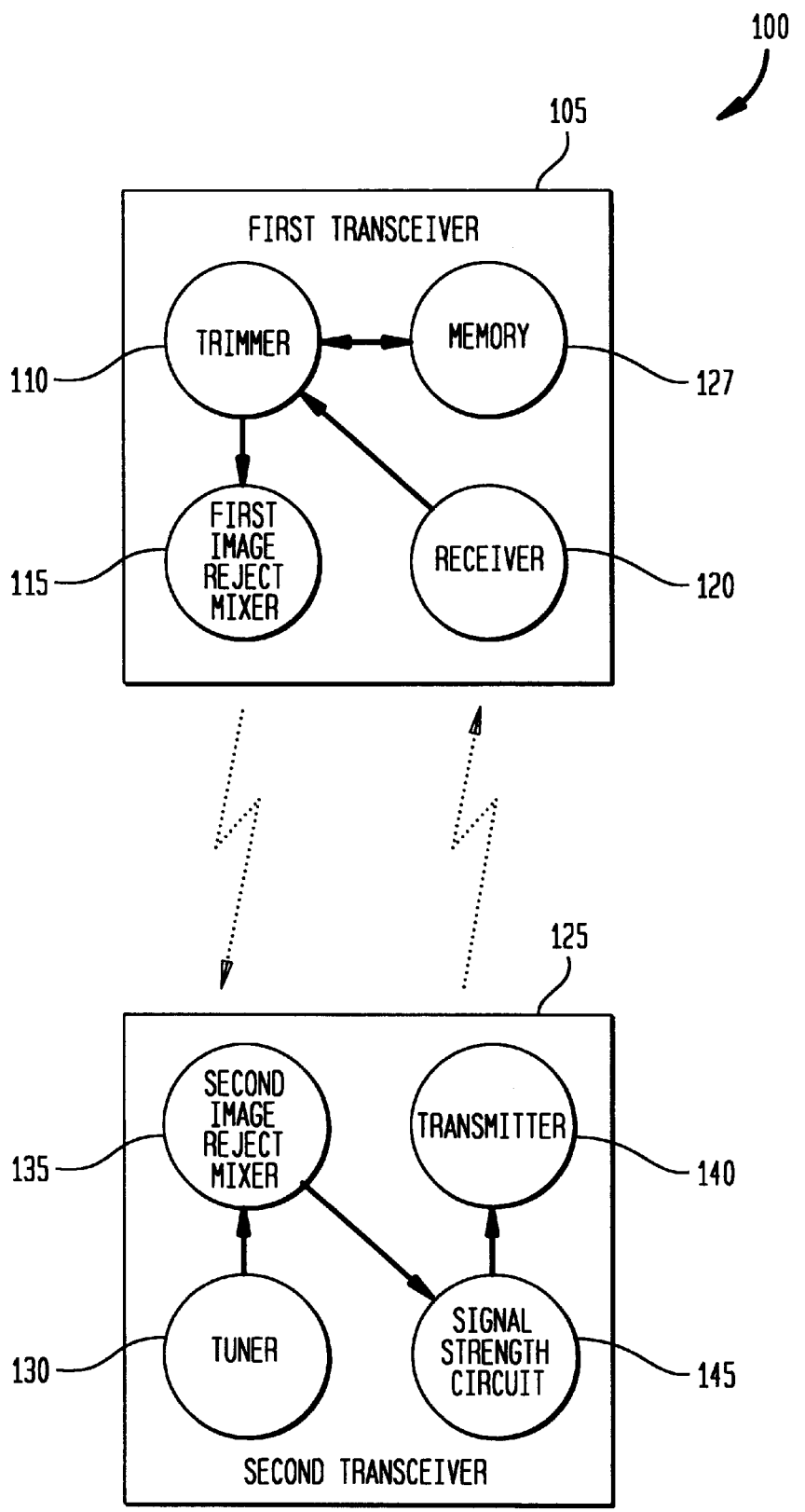
FIG. 1 illustrates a system showing an embodiment of the present invention.

Referring initially to FIG. 1, illustrated is a system 100 showing an embodiment of the present invention. System 100 includes a first transceiver 105 which also includes a first image reject mixer 115, a receiver 120, a trimmer 110 and a memory 127 and a second transceiver 125 which includes a second image reject mixer 135, a transmitter 140, a tuner 130 and a signal strength circuit 145. The system 100 provides a system for, and method of, calibrating the first image reject mixer 115 in the first transceiver 105 having first and second image products in a cordless telephone.

In this embodiment, the system 100 includes the a second image reject mixer 135 associated with a second transceiver 125 tuned to a rejected one of the first and second image products and the signal strength circuit 145 coupled to the second image reject mixer 135 that determines a signal strength of the rejected one. Additionally, the trimmer 110 associated with the first image reject mixer 115 trims the first image reject mixer 115 to move the rejected one toward an optimal value of the signal strength.

The present invention therefore introduces a calibration procedure that employs feedback to optimize the rejected image product. The first image reject mixer 115 is advantageously trimmed until the rejected image product is optimally diminished. Optimally does not necessarily mean minimally, as discussed earlier, since other factors may come into play in trimming the image product mixer 115 of the first transceiver 105. However, the signal strength of the rejected image product can, by means of the present invention, be a component in the trimming process. The trimmer may include manually tunable devices, such as potentiometers, as well as trimming circuitry or functional blocks that may be contained in integrated circuitry or embodied in digital form such as software or firmware.

In this embodiment, the first transceiver 105 is contained in a handset and the second transceiver 125 is contained in a corresponding base unit of a cordless telephone. The calibration is performed while the handset is cradled in the base unit since it is preferable to calibrate the first and second transceivers 105, 125 with their respective first and second image reject mixers 115, 135 while they are in proximity to one another, allowing maximum signal strength. Those skilled in the art will recognize, however, that the present invention is limited neither to close-range calibration or cordless telephone applications.

The second transceiver 125 transmits a signal that depends on the signal strength to the first transceiver 105 on the accepted (or non-rejected) first or second image product, as the case may be. Thus, the non-rejected image product may be allowed to complete the feedback loop between the signal-strength-determining second transceiver 125 and the first image reject mixer 115 being trimmed.

The trimmer 110 may continue to trim the first transceiver 105 after the rejected image product attains the optimal signal strength at the second transceiver 125. This may indicate that other factors influence the final frequency at which the first image reject mixer 115 is trimmed. Alternatively, the signal strength of the rejected image product may be the only desired factor, in which case trimming of the first image reject mixer 115 advantageously ceases upon optimization of the signal strength.

The system 100 further includes the memory 127, associated with the first image reject mixer 115, that contains an optimal adjustment for the rejected image product. Thus, the present invention contemplates an embodiment wherein calibration of the adjustment is a one-time operation, perhaps performed at the factory. Alternatively, the system 100 can function during an idle time of the first and second image reject mixers 115, 135. This allows recalibration, wherein changing conditions may call for modifications to image reject mixer trimming.

The calibrating performed may be an iterative process. Thus, signal strength is determined, the first image reject mixer 115 is trimmed, signal strength is redetermined, and so on until optimization occurs. Alternatively, with an understanding of the relationship between adjustments and resulting signal strength, calibration can be performed in one step.

Figure 2:
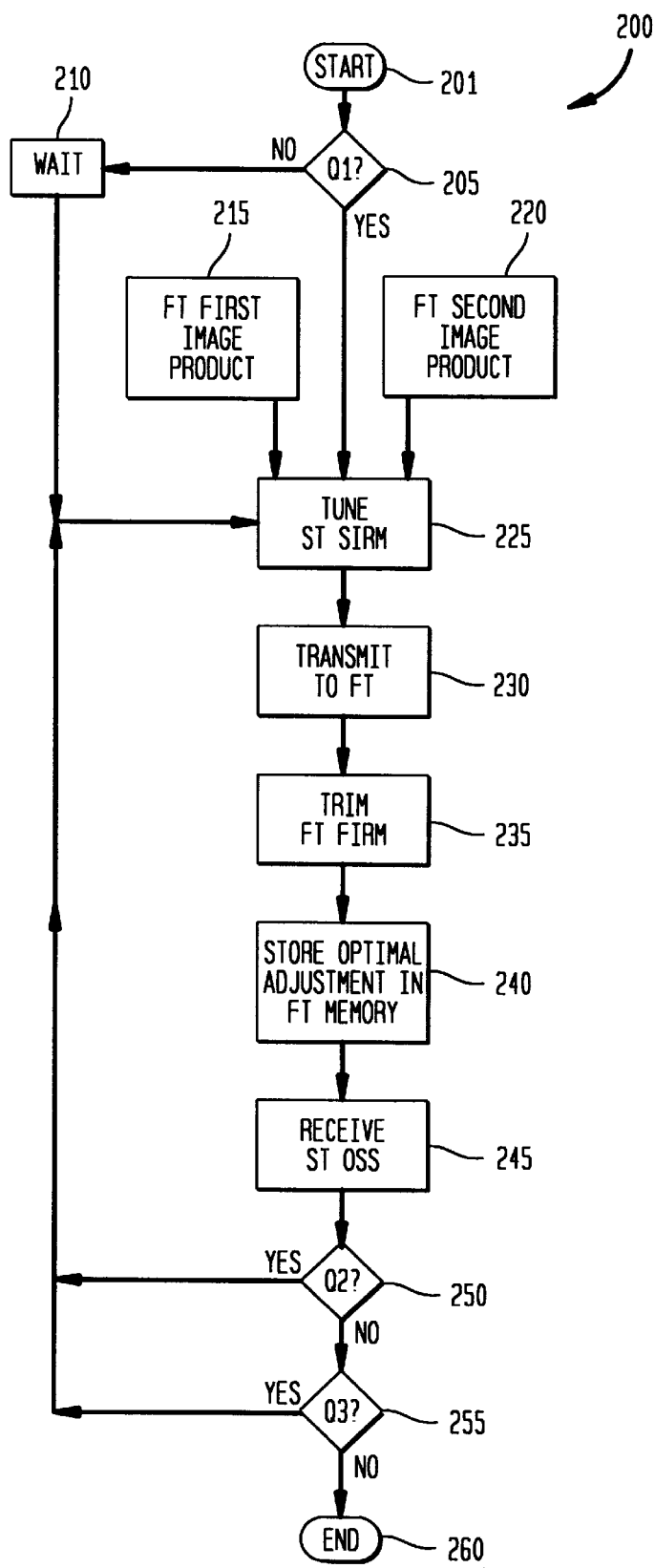
FIG. 2 illustrates a method of calibrating a first image reject mixer having first and second image products in an embodiment of the present invention.

Turning now to FIG. 2, illustrated is a method of calibrating a first transceiver having first and second image products in an embodiment of the present invention. A flowchart 200 depicts the method of calibration wherein the first transceiver may be a handset and a second transceiver may be a corresponding base unit of a cordless telephone, and the steps of tuning and trimming may be carried out while the handset is cradled in the base unit. The calibration method begins with START (a step 201) and moves to a first question Q1 (a step 205) that determines whether a call is presently in process or if the unit is inactive. Calibration may be carried out during an idle or inactive time of the first and second transceivers, if desired.

If the answer is NO, then the unit is actively calling and the calibration is directed to WAIT (a step 210) where the calibration waits until the call is inactive. If the answer to the first question Q1 (the step 205) is YES, or the call becomes inactive while in WAIT (the step 210), the calibration proceeds with TUNE ST SIRM (a step 225) for the second transceiver (ST) and its corresponding second image reject mixer (SIRM). This tunes the ST SIRM to a rejected one of an FT first and second image products which are represented by FT FIRST IMAGE PRODUCT (a step 215) and a FT SECOND IMAGE PRODUCT (a step 220), indicating that the appropriate image products are available.

Then, the calibration moves to TRANSMIT TO FT (a step 230) which comprises the step of transmitting a signal that depends on the signal strength of the non-rejected image product from the ST to the FT. The calibration then moves to TRIM FT FIRM (a step 235) where the FT first image reject mixer (FIRM) is trimmed until the rejected image product attains an optimal signal strength (OSS) at the ST SIRM. The calibration moves to STORE OPTIMAL ADJUSTMENT IN FT MEMORY (a step 240) which allows the storing of an optimal adjustment for the rejected image product in a memory associated with the FT. RECEIVE ST OSS (a step 245) verifies the reception of an ST OSS.

A second question Q2 (a step 250) asks if the step of continuing to trim the transmitter after the rejected image product attains the OSS at the receiver is required. If the answer is YES, the calibration returns to TUNE ST SIRM (the step 225) and continues as shown. If the answer to the question Q2 (the step 250) is NO, the calibration moves to a third question Q3 (a step 255). The third question Q3 (the step 255) asks if repeating the step of trimming as an iterative process is required. If the answer is YES, calibration moves to TUNE ST SIRM (the step 225) and continues as shown. If the answer to the third question Q3 (the step 255) is NO, the calibration moves to END (a step 260) and the calibration stops.

Turning now to FIG. 3A and 3B, illustrated are diagrams of a cordless telephone 300 employing an embodiment of the present invention. In FIG. 3A, the cordless telephone 300 comprises a handset 305 having a single sideband handset transceiver 310, a base unit 315 having a single sideband base unit transceiver 320 and control circuitry 325, associated with the handset and base unit transceivers 310, 320. The control circuitry 325 tunes the base unit transceiver 320 to a first rejected image product and trims the handset transceiver 310 until the rejected image product attains an optimal signal strength at the base unit 315.

In FIG. 3B, the same cordless telephone 300 comprises the handset 305 having a single sideband handset transceiver 310, the base unit 315 having the single sideband base unit transceiver 320 and the control circuitry 325, associated with the handset and base unit transceivers 310, 320. The control circuitry 325 tunes the handset transceiver 310 to a second rejected image product and trims the base unit transceiver 320 until the second rejected image product attains an optimal signal strength at the handset 305. Thus, FIG. 3 shows the trimming of both the handset and base transmitter image reject mixers. Of course, both the handset and base receiver image reject mixers may also be similarly adjusted in ID order to completely optimize the rejected image products.

The cordless telephone 300 may have first and second rejected image products that are identical, and the control circuitry 325 may be operable while the handset 305 is cradled in the base unit 315. The cordless telephone 300 may further comprise a memory, associated with the handset and base unit transceivers 310, 320 respectively, that contains an optimal adjustment for the first and second rejected image products.

The control circuitry 325 causes the handset transceiver 310 and the base unit transceiver 320 to transmit a signal that may depend on the signal strength of an accepted image product. The control circuitry 325 may operate during an idle time of the handset and the base unit transceivers 310, 320 respectively, and the control circuitry 325 may continue to trim the handset and base unit transceivers 310, 320 respectively, after the first and second rejected image products attain their optimal signal strength.

Although the present invention has been described in detail, those skilled in the art should understand that they can make various changes, substitutions and alterations herein without departing from the spirit and scope of the invention in its broadest form.

What is claimed is:

1. For use with a first transceiver, a system for calibrating a first image reject mixer therein having first and second image products, comprising:
    a second image reject mixer, associated with a second transceiver and tuned to a rejected one of said first and second image products;
    a signal strength circuit, coupled to said second image reject mixer, that determines a signal strength of said rejected one; and
    a trimmer, associated with said first image reject mixer, that trims said first image reject mixer to move said rejected one toward an optimal value of said signal strength.

2. The system as recited in claim 1 wherein said first transceiver is contained in a handset and said second transceiver is contained in a corresponding base unit of a cordless telephone, said calibrating performable while said handset is cradled in said base unit.

3. The system as recited in claim 1 wherein said second transceiver transmits a signal that depends on said signal strength to said first transceiver on a channel separate from said rejected one.

4. The system as recited in claim 1 wherein said trimmer continues to trim said first image reject mixer after said rejected one attains said optimal signal strength at said second image reject mixer.

5. The system as recited in claim 1 further comprising a memory, associated with said first image reject mixer, that contains an optimal adjustment for said rejected one.

6. The system as recited in claim 1 wherein said system functions during an idle time of said first and second image reject mixers.

7. The system as recited in claim 1 wherein said calibrating is performed as an iterative process.

8. A method of calibrating a first image reject mixer of a first transceiver having first and second image products, comprising:
    tuning a second image reject mixer of a second transceiver to a rejected one of said first and second image products; and
    trimming said first image reject mixer to move said rejected one toward an optimal signal strength at said second transceiver.

9. The method as recited in claim 8 wherein said first transceiver is contained in a handset and said second transceiver is contained in a corresponding base unit of a cordless telephone, said tuning and trimming carried out while said handset is cradled in said base unit.

10. The method as recited in claim 8 further comprising transmitting, from said second transceiver to said first transceiver, a signal that depends on said signal strength on a channel separate from said rejected one.

11. The method as recited in claim 8 further comprising continuing to trim said transmitter after said rejected one attains said optimal signal strength at said second image reject mixer.

12. The method as recited in claim 8 further comprising storing an optimal adjustment for said rejected one in a memory associated with said first image reject mixer.

13. The method as recited in claim 8 wherein said method is carried out during an idle time of said first and second image reject mixers.

14. The method as recited in claim 8 further comprising repeating said step of trimming as an iterative process.

15. A cordless telephone, comprising:
    a handset having a single sideband handset transceiver;
    a base unit having a single sideband base unit transceiver; and
    control circuitry, associated with said handset and base unit transceivers, that:
        tunes an image reject mixer of said base unit transceiver to a first rejected image product and trims an image reject mixer of said handset transceiver to move said first rejected image product toward an optimal signal strength at said base unit, and
        tunes said image reject mixer of said handset transceiver to a second rejected image product and trims said image reject mixer of said base unit transceiver to move said second rejected image product toward an optimal signal strength at said handset.

16. The cordless telephone as recited in claim 15 wherein said single sideband handset and base unit transceivers are identical, said control circuitry operable while said handset is cradled in said base unit.

17. The cordless telephone as recited in claim 15 wherein said control circuitry causes said handset transceiver and said base unit transceiver to transmit a signal that depends on said signal strength of an accepted image product.

18. The cordless telephone as recited in claim 15 wherein said control circuitry continues to trim said image reject mixers of said handset and base unit transceivers after said first and second rejected image products attain said optimal signal strength.

19. The cordless telephone as recited in claim 15 further comprising a memory, associated with said handset and base unit transceivers, that contains an optimal adjustment for said first and second rejected image products.

20. The cordless telephone as recited in claim 15 wherein said control circuitry operates during an idle time of said handset and base unit transceivers.

* * * * *